(12) United States Patent
Briaire

(10) Patent No.: US 10,771,077 B1
(45) Date of Patent: Sep. 8, 2020

(54) HYBRID RETURN-TO-ZERO VOLTAGE-MODE DAC DRIVER

(71) Applicant: Aquantia Corporation, San Jose, CA (US)

(72) Inventor: Joseph Briaire, Mol (BE)

(73) Assignee: Marvell Asia Pte., LTD, Singapore (SG)

( * ) Notice: Subject to any disclaimer, the term of this patent is extended or adjusted under 35 U.S.C. 154(b) by 0 days.

(21) Appl. No.: 16/354,512

(22) Filed: Mar. 15, 2019

(51) Int. Cl.
*H03M 1/06* (2006.01)
*H03M 1/08* (2006.01)

(52) U.S. Cl.
CPC .................... *H03M 1/0863* (2013.01)

(58) Field of Classification Search
CPC ....... H03M 1/0863; H03M 1/66; H03M 1/747
USPC .................................................. 341/118, 155
See application file for complete search history.

(56) References Cited

U.S. PATENT DOCUMENTS

| | | | |
|---|---|---|---|
| 4,517,551 A * | 5/1985 | Campbell, Jr. ......... | H03M 1/74 341/122 |
| 5,059,978 A | 10/1991 | Valdenaire | |
| 5,689,259 A * | 11/1997 | Ozguc .................... | H03M 1/662 341/144 |
| 6,061,010 A | 5/2000 | Adams et al. | |
| 7,652,607 B2 * | 1/2010 | Edwards ............... | H03M 1/002 341/144 |
| 7,675,450 B1 | 3/2010 | Tabatabaei et al. | |
| 7,714,759 B1 | 5/2010 | Mu | |
| 8,493,257 B2 * | 7/2013 | Nagatani ............... | H03M 1/662 341/118 |
| 8,779,956 B2 * | 7/2014 | Rangan ................. | H03M 3/428 341/118 |
| 9,583,241 B1 | 2/2017 | Dempsey | |
| 2008/0001801 A1 | 1/2008 | Nhuyen | |
| 2010/0052963 A1 | 3/2010 | Soude et al. | |

* cited by examiner

*Primary Examiner* — Jean B Jeanglaude

(57) ABSTRACT

A voltage-mode digital-to-analog converter (DAC) includes multiple bit processing circuits to generate an output voltage responsive to a binary input. Each of the multiple bit processing circuits includes a first switch circuit and a second switch circuit. The first switch circuit is to selectively couple one of multiple reference voltages to a first output load in response to receiving a first input bit during a first bit time. The first output load has a value proportional to d. The second switch circuit is to selectively couple one of the multiple reference voltages to a second output load in response to receiving a second input bit during a second bit time. The second output load has a value corresponding to the first output load. The first and second output loads are disposed in parallel, and serially couple to a third output load having a value proportional to (1-d).

17 Claims, 5 Drawing Sheets

US 10,771,077 B1

HYBRID RETURN-TO-ZERO VOLTAGE-MODE DAC DRIVER

TECHNICAL FIELD

The disclosure herein relates to the field of digital to analog conversion.

BACKGROUND

Digital-to-analog converters (DACs) play a critical role in transforming information from a digital domain into an analog domain. DACs generally convert an abstract finite precision number (such as a fixed-point binary number) into a physical quantity (such as a voltage or current). The number of output levels for a given DAC generally corresponds to its resolution, which is based on the number of "bits" of a given digital code that defines each output level. A variety of DAC architectures exist, including voltage-mode schemes and current steering schemes.

FIG. 1 illustrates a voltage-mode DAC, generally designated 100. The DAC includes a data input 102 that receives a data word of multiple bits during a bit time and a clock input 104 that receives a clock. Respective supply (VDD) and ground (VSS) reference voltages are provided to the DAC. Switch circuitry (not shown) responds to the clock to generate corresponding outputs that are weighted and summed to create an overall output voltage level corresponding to the input word code, but in the analog domain.

FIG. 2A illustrates one conventional approach in generating the output voltage level for a DAC. The DAC includes respective DAC drivers $200_0$-$200_{n-1}$ for processing each "bit" $b_0$-$b_{n-1}$ of the input word. Each driver includes a first switch SW1 that selectively couples an output resistance $R_{OUT}$ to the supply voltage $V_{DD}$. A second switch SW2 selectively couples the output resistance to the ground voltage $V_{SS}$. The switches cooperate to form a push-pull driver. In practice, the switching moments of each switch are individually tuned during manufacture such that both switches are not closed at the same moment, which would create undesirable crow-bar currents. Often, the switches are driven very quickly to also minimize undesirable high-ohmic output states, which distort the output impedance. This "direct" switching approach may be susceptible to data-dependent distortion, such as through inter-symbol interference (ISI) and other errors.

In an effort to improve on the "direct" switching approach, the driver circuitry may be split into two circuits, such as shown in FIG. 2B, at 202 and 204. The split driver circuitry includes a separate output resistance $R_{OUT}$ for each of the sub-drivers. This double load solution dampens any short-circuit current that may occur should both switches be simultaneously closed. However, both loads are typically not exactly equal. Thus, depending on the data, the load may change. Employing a return-to-zero switching protocol minimizes data-dependent switch current in favor of a clock-dependent switching current. However, the dual load approach may still be subject to influences on the output impedance resulting from parasitic capacitances from the split driver circuits. What is needed is a power-efficient method and apparatus to support switching operations for a voltage-mode DAC driver.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of apparatus and methods for digital-to-analog conversion are disclosed. For one embodiment, a voltage-mode digital-to-analog converter (DAC) is disclosed that includes multiple bit processing circuits to generate an output voltage responsive to a binary input. Each of the multiple bit processing circuits includes a first switch circuit and a second switch circuit. The first switch circuit is to selectively couple one of multiple reference voltages to a first output load in response to receiving a first input bit during a first bit time. The first output load has a value proportional to d. The second switch circuit is to selectively couple one of the multiple reference voltages to a second output load in response to receiving a second input bit during a second bit time. The second output load has a value corresponding to the first output load. The first and second output loads are disposed in parallel, and serially couple to a third output load having a value proportional to (1-d).

In a further embodiment, A method of operation in a voltage-mode DAC is disclosed. The method includes operating multiple bit processing circuits to generate an output voltage responsive to a binary input. The operating of each of the multiple bit processing circuits including selectively coupling one of multiple reference voltages to a first output load in response to receiving a first input bit during a first bit time. The first output load has a value proportional to d. One of the multiple reference voltages is selectively coupled to a second output load in response to receiving a second input bit during a second bit time. The second output load has a value corresponding to the first output load. The first and second output loads are disposed in parallel, and serially couple to a third output load having a value proportional to (1-d).

In yet another embodiment, a voltage-mode driver is disclosed. The voltage-mode driver includes a first voltage-mode sub-driver and a second voltage-mode sub-driver. The first voltage-mode sub-driver is to selectively couple one of multiple reference voltages to a first output load in response to receiving a first input bit during a first bit time. The first output load has a value proportional to d. The second voltage-mode sub-driver is to selectively couple one of the multiple reference voltages to a second output load in response to receiving a second input bit during a second bit time. The second output load has a value corresponding to the first output load. The first and second output loads are disposed in parallel, and serially couple to a third output load having a value proportional to (1-d).

Figure 1:
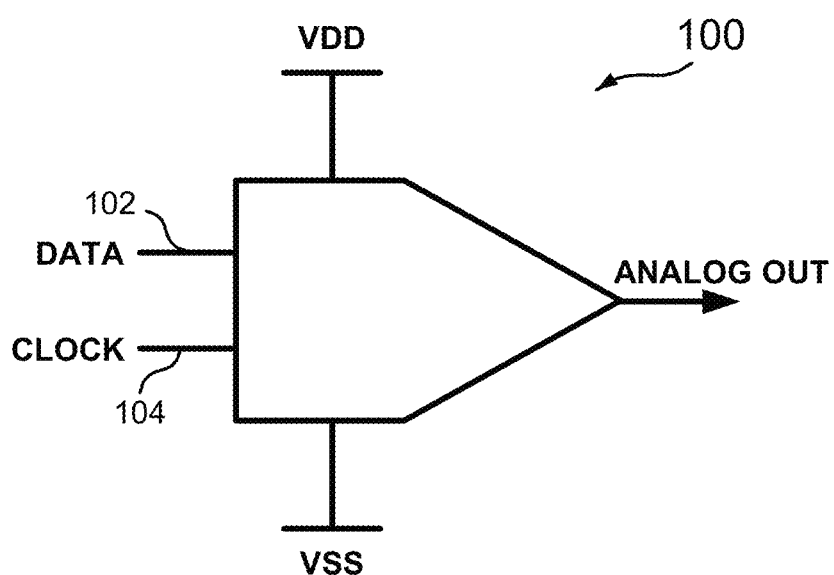
FIG. 1 illustrates a conventional digital-to-analog converter (DAC).
Figure 2A:
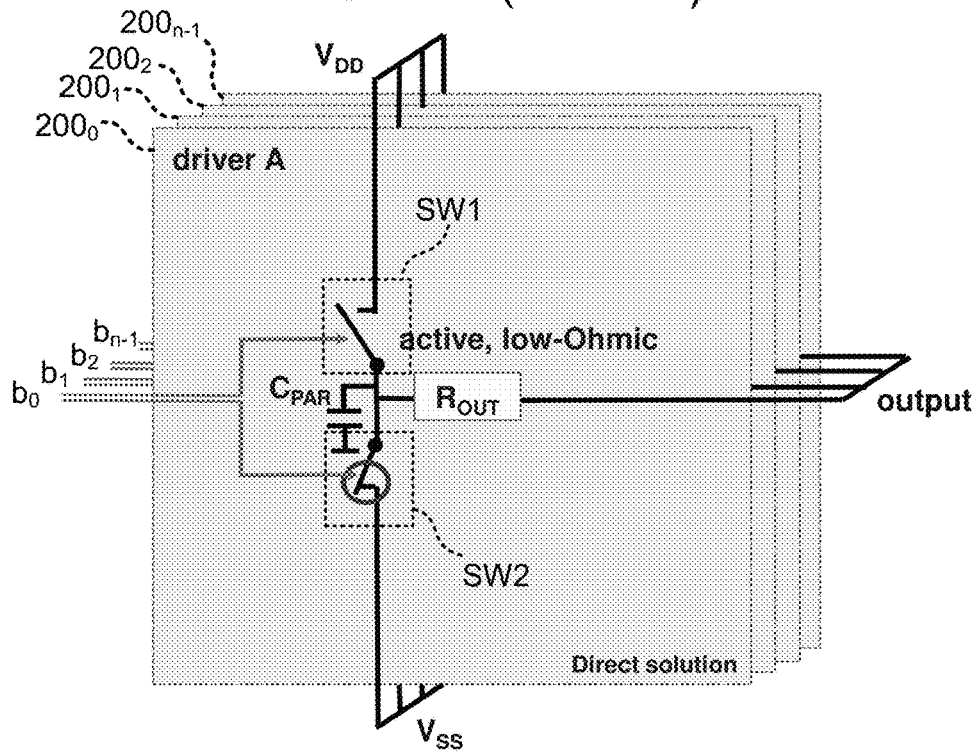
FIG. 2A illustrates further detail of one embodiment of a conventional DAC.
Figure 2B:
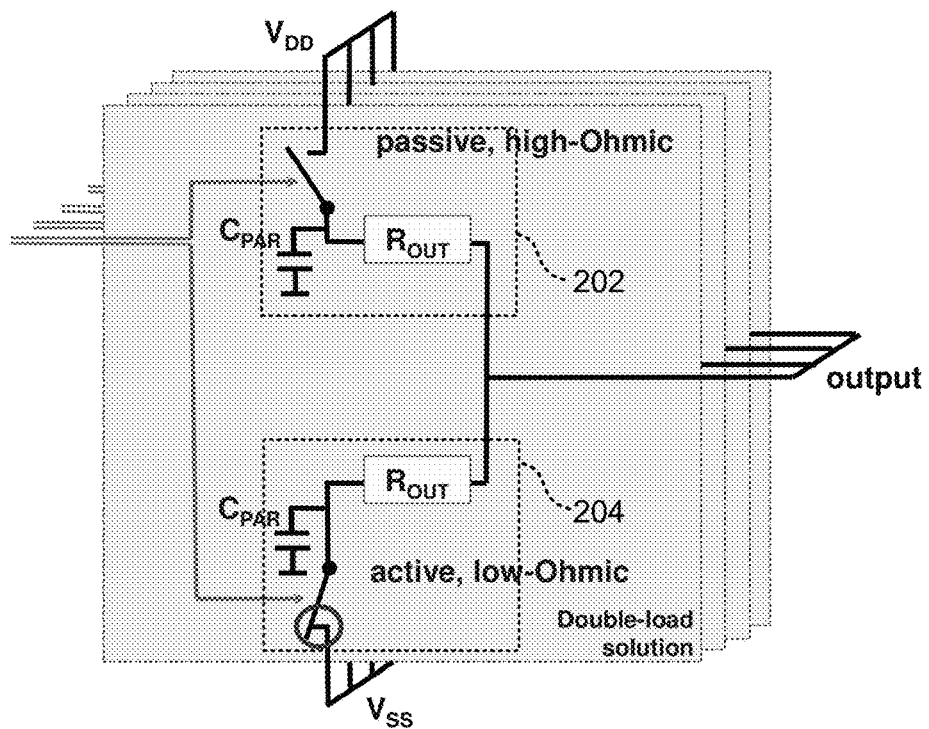
FIG. 2B illustrates further detail of a further embodiment of a conventional DAC similar to that of FIG. 2A.
Figure 3:
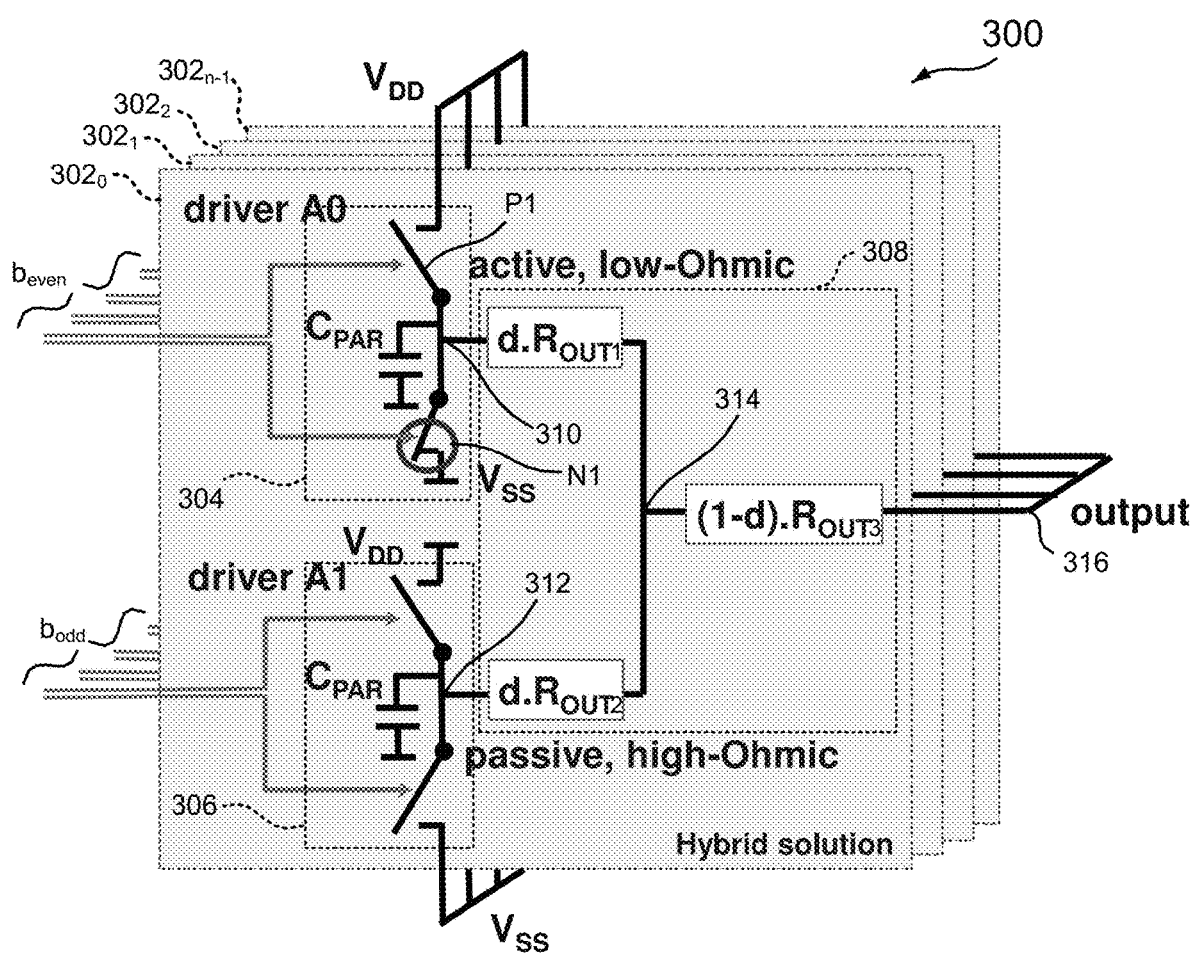
FIG. 3 illustrates one embodiment of an improved DAC architecture.

FIG. 3 illustrates a block diagram of one embodiment of a voltage-mode DAC architecture, generally designated 300, that provides for power-efficient switching operations. The architecture includes multiple bit processing circuits $302_0$-$302_{n-1}$ corresponding to the number of bits "n" in each DAC codeword. Each bit processing circuit includes respective even and odd sub-drivers 304 and 306 that interface with an output impedance network 308 such that only one sub-driver is active per codeword and this alternates per codeword update. As more fully described below, the output impedance network is tunable to exhibit reduced crowbar currents, clock-dependent switching current, and minimal parasitic capacitance characteristics.

Further referring to FIG. 3, for one embodiment, the even and odd sub-drivers 304 and 306 generally take the form of push-pull drivers. Such drivers generally push current into an output node in response to an input signal of a first value, and pull current from the node in response to the input signal having a second value. In this case a sub-driver 304 receives independent input signals $b_{even\text{-}push}$ for the push leg P1 and $b_{even\text{-}pull}$ for the pull leg N1. This way the sub-driver can not only be controlled as a push-pull driver by turning either $b_{even\text{-}push}$ or $b_{even\text{-}pull}$ on but it can also be turned off by turning both $b_{even\text{-}push}$ and $b_{even\text{-}pull}$ off. In this case the fourth state where both $b_{even\text{-}push}$ and $b_{even\text{-}pull}$ are turned on is a forbidden state since it would lead to a short-circuit between $V_{DD}$ and $V_{SS}$. The input signals to sub-drivers 304 and 306 are now configured such that one sub-driver is off while the other is in push-pull mode and this alternates for each next input signal. Thus, during an even ("even" being arbitrary, just different than "odd") bit time, a first code word is only applied to the even sub-drivers of the multiple bit processing circuits, while during an odd bit time, a second code word is only applied to the odd sub-drivers across the multiple bit processing circuits. As a result an individual sub-driver now always follows the pattern . . . -off-data-off-data- . . . such that it always starts from an off-state before being activated. This is typically called a return-to-zero (RTZ) pattern. This way even a temporary short-circuit can be avoided which could otherwise occur when one sub-driver would switch directly from push- to pull state or vise versa. Furthermore, the embodiment shown in FIG. 3 reflects a single-ended configuration for purposes of clarity, but a more practical application would be differential, involving twice the single-ended structure with inverse data for the second structure. In this case the RTZ nature would lead to clock-dependent switching currents instead of data-dependent switching currents because in the combined differential structure for each slice and at each clock cycle exactly one sub-driver turns from off to push-state, one from off to pull-state, one from push-state to off and also one from pull-state to off. And this repeats itself for every clock-cycle while the DAC is active. For some embodiments, the bitline input for each sub-driver couples to an n-channel transistor (shown as a switch, at N1) and a p-channel transistor (shown as a switch, at P1) that are disposed in series to form a push-pull switch configuration. A first supply voltage reference $V_{DD}$ is fed to the P-channel transistor, while the N-channel transistor couples to a ground voltage source $V_{SS}$. Each sub-driver includes an output node at 310 and 312.

With continued reference to FIG. 3, the output nodes at 310 and 312 connect to the output impedance network 308 via respective first and second output resistances $R_{OUT1}$ and $R_{OUT2}$. The resistance loads are intended to be of a same resistance value and are both proportional to a scaling value "d." For one embodiment, the scaling value d ranges from 0 to 1, such as 0.40. The resistances $R_{OUT1}$ and $R_{OUT2}$ may differ slightly due to manufacturing variations. Also shown is a capacitance $C_{PAR}$ at each node 310 and also at 312 which represents the distributed parasitic capacitance at this node. When a sub-driver is active (push/pull-mode) this capacitance is irrelevant because it will be short-circuited to either $V_{DD}$ or $V_{SS}$ because one of the switches will be closed. In off-mode however, both switches are open and this will therefore lead to a certain capacitance which influences the total driver-impedance as seen from the output node 316. To reduce this effect, $R_{OUT1}$ and $R_{OUT2}$ are not directly connected to the DAC output node 316. Instead both resistances are tied in parallel to a driver output node at 314 that also connects to one end of a third output resistance $R_{OUT3}$ that is proportional to the value (1-d), such as 0.60. The other end of the third resistance $R_{OUT3}$ is tied to an aggregated DAC output node, at 316. The resulting output impedance is thus based on the scaling factor d, and a relative frequency error based on the clock frequency f, the load $R_{OUT}$ and the parasitic capacitance CPA of the push-pull sub-driver transistors. The output impedance may be represented by the relationship:

$$Z_A(f_{REL},d) = R_{OUT} \times (1 - d/2 \times (if_{RE}/d)/(1 + if_{REL}/d))$$

where $f_{REL}$ is $4\pi f(R_{OUT})(C_{PAR})$. Thus, by varying or tuning the scaling factor value d, one may achieve a DAC output stage that provides benefits associated with both "direct" and "split-driver" DAC architectures. The resulting hybrid DAC architecture minimizes crowbar currents, parasitic capacitance, and provides clock-dependent switching current.

In operation, as a given bit, such as $b_0$, is received by a sub-driver, the push-pull configuration results in either $V_{DD}$ (in the case of $b_{0\text{-}push}$ being a logic "1") or $V_{SS}$ (in the case of $b_{0\text{-}pull}$ being a logic "1") being fed to the output load $(d)R_{OUT}$. A switching current is thus either "pushed" to the output node or "pulled" from the output load to ground. Moreover, the sub-drivers in each bit processing circuit alternate in an even and odd fashion, such that for a first bit time, the even sub-driver is active while the odd sub-driver is inactive. For a subsequent bit time, the even sub-driver is inactive while the odd sub-driver is active. This works well for a return-to-zero (RTZ) switching sequence or protocol, where the DAC output is forced to start from zero, reach its final analog value, and return to zero all within a single bit clock period. Utilizing an RTZ switching protocol prevents the switching current from being data-dependent, and instead, becoming clock-dependent. A clock-dependent switching current is less susceptible to data distortion, such as inter-symbol interference (ISI).

As noted above, the multiple bit processing circuits are configured and aggregated such that a multi-bit codeword having, for example, a 12-bit resolution (thus twelve bit processing circuits provided in parallel to an aggregated output), can be processed during a given bit time to produce a corresponding analog voltage at the aggregated output.

Figure 4:
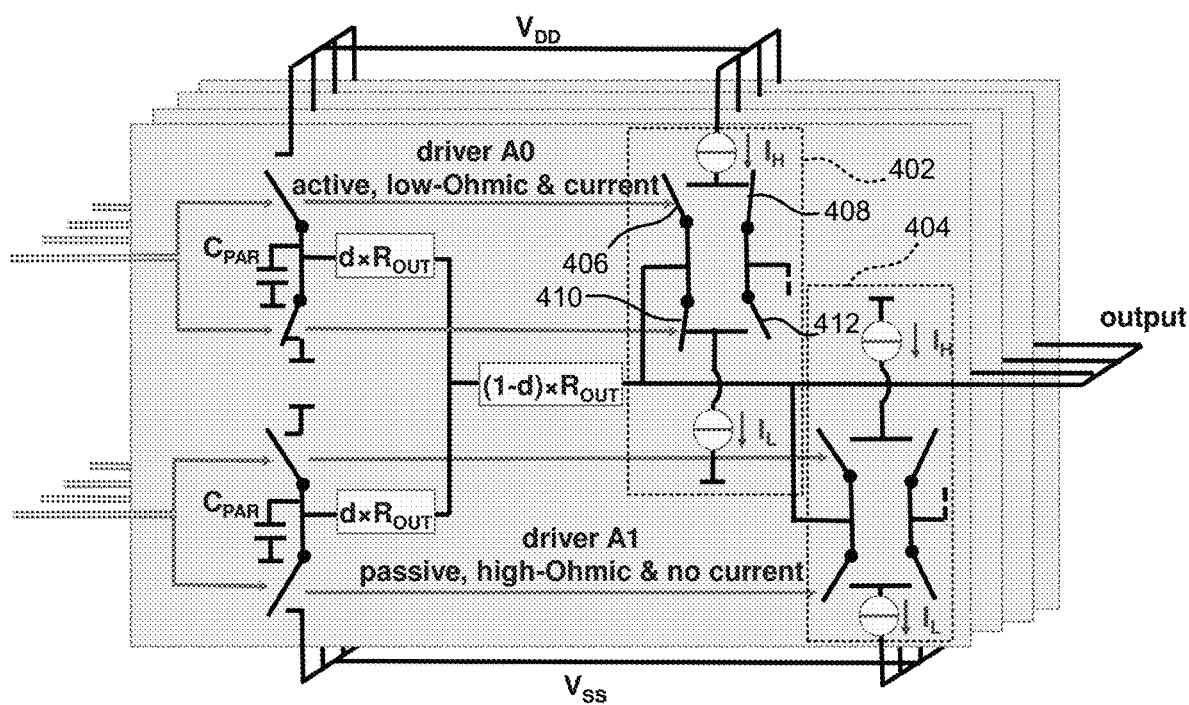
FIG. 4 illustrates a further embodiment of an improved DAC similar to that of FIG. 3.

FIG. 4 illustrates a voltage-mode DAC architecture similar to that of FIG. 3, with the addition of current-steering circuitry in the output stage to address common mode-related noise and/or distortion. The current steering circuitry may be implemented on each bit processing circuit and includes respective even and odd current-mode sub-drivers 402 and 404 that correspond to the voltage-mode sub-drivers 302 and 304 of FIG. 3. Each of the current-mode sub-drivers 402 and 404 includes a "high" current source $I_H$ coupled to the supply voltage VDD, and a low current source $I_L$, coupled to ground $V_{SS}$. Multiple switches 406, 408, 410, and 412 in the form of transistors selectively couple $I_H$ and $I_L$ to the DAC output, depending on the input data logic value. Although slightly more power may be consumed during operation, use of the tunable currents provides significant elimination of common-mode effects.

Figure 5:
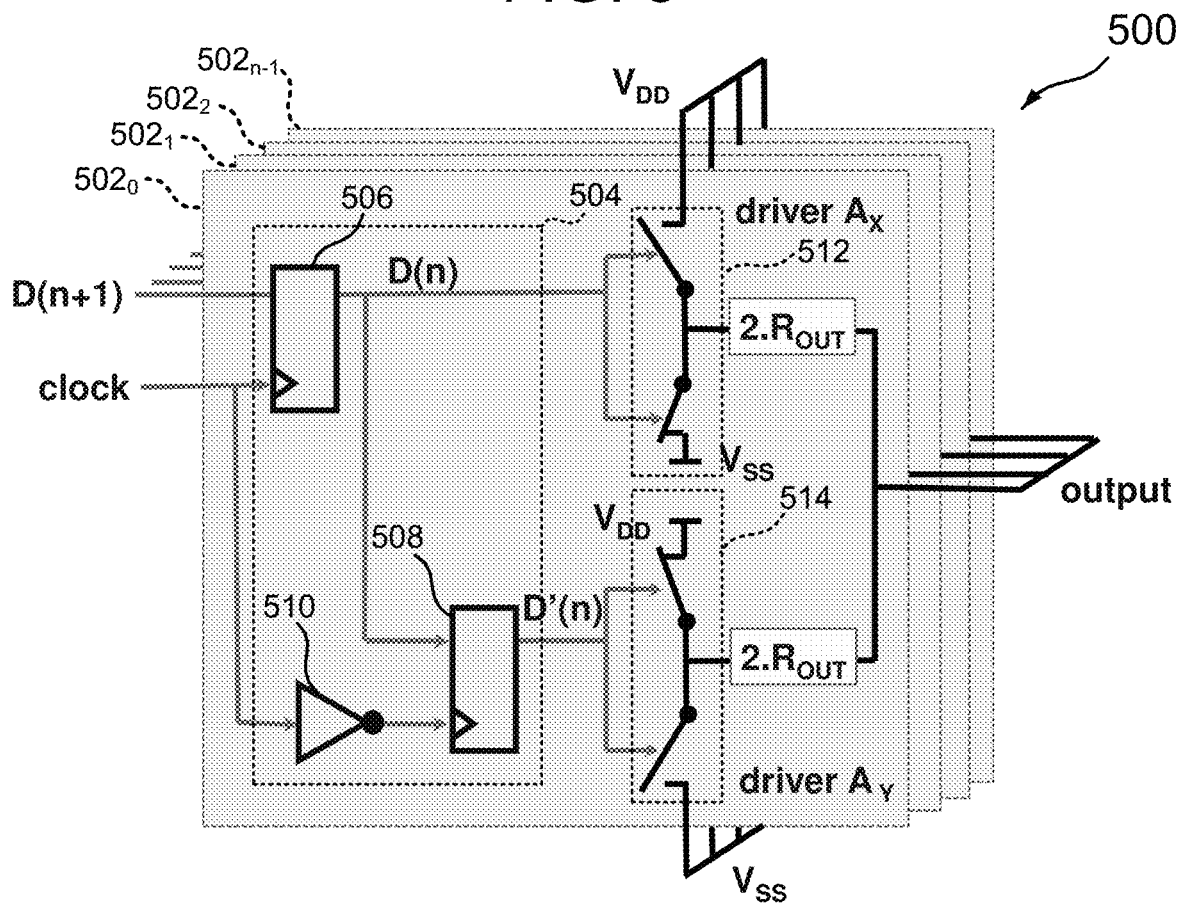
FIG. 5 illustrates a further embodiment of an improved DAC similar to those of FIGS. 3 and 4.

FIG. 5 illustrates an embodiment of a voltage-mode DAC architecture, generally designated 500, that incorporates an analog interpolated Zero-order-Hold circuit. The architecture includes circuitry that addresses excessive power consumption for out-of-band filtering of the DAC driver output signal. Similar to the architecture shown in FIG. 3, multiple bit processing circuits $502_0$-$502_{n-1}$ are provided, each tasked with generating an analog output in response to receiving a digital input. Each bit processing circuit includes delay logic 504 having a first flip-flop stage 506 that receives a current bit value D(n+1) in response to a clock signal "clock." A second flip-flop stage 508 receives the output (a preceding bit value D(n)) of the first flip-flop 506 in response to a delayed version of the clock signal via delay element 510, and generates an output D'(n) in response to the delayed clock. For one embodiment, the clock delay is half a clock cycle.

Figure 6:
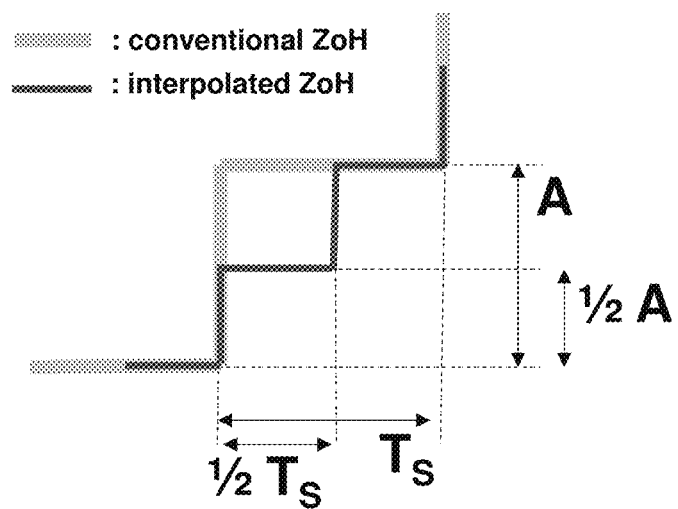
FIG. 6 illustrates an output waveform resulting from the input circuitry shown in the DAC embodiment of FIG. 5.

Further referring to FIG. 5, the preceding bit value D(n) is fed to a first DAC circuit 512 that may be formed similarly to the DAC described with respect to FIG. 3. The first DAC may be configured with an output resistance $2\times R_{OUT}$. A second DAC circuit 514 formed similarly to the first DAC receives the delayed version of the previous bit D'(n). The resulting output alternatingly generates a first analog value based on the value of D(n) during a first half of a bit time $T_S$, and a second analog value based on the value of D'(n) during a second half of the bit time $T_S$. The resulting interpolated waveform is shown in FIG. 6.

Generally speaking, the architecture described above provides a 2× up-sampler with a mid-point filter by using DAC structures similar to those described herein. As a result, basic data-interpolation and filtering may be achieved with little to no additional driver power consumption. Moreover, the clock can remain at the same rate as the input data. For embodiments that employ voltage-mode drivers as the sub-drivers, the output impedance is constrained to be a maximum of twice the nominal impedance during switching, rather than potentially infinite. Lastly, errors in either the clock duty-cycle or amplitude mismatch between the phase-offset data paths will not lead to distortion, but rather a reshaping of the linear filter.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<span style="text-decoration:overline">signalname</span>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A voltage-mode digital-to-analog converter (DAC), comprising:
multiple bit processing circuits to generate an output voltage responsive to a binary input, each of the multiple bit processing circuits including
a first switch circuit to selectively couple one of multiple reference voltages to a first output load in response to receiving a first input bit during a first bit time, the first output load having a value proportional to a scaling value d, a second switch circuit to selectively couple one of the multiple reference voltages to a second output load in response to receiving a second input bit during a second bit time, the second output load having a value corresponding to the first output load, and wherein the first and second output loads are disposed in parallel, and serially couple to a third output load having a value proportional to a relationship (1-d).

2. The voltage-mode DAC according to claim 1, wherein the first and second switch circuits each comprise push-pull voltage-mode sub-drivers.

3. The voltage-mode DAC according to claim 1, wherein the scaling value d comprises a selectable value between 0 and 1 such that the first and second output loads cooperate to exhibit hybrid direct driver and split driver characteristics.

4. The voltage-mode DAC according to claim 1, wherein the first and second switching circuits are sequenced during the first and second bit times in accordance with a return-to-zero protocol.

5. The voltage-mode DAC according to claim 1, further comprising:
a current-steering output stage coupled to the third output load.

6. The voltage-mode DAC according to claim 5, wherein the current-steering output stage includes tunable current source/sink circuitry to compensate for common-mode data signals.

7. The voltage-mode DAC according to claim 1, wherein the first and second switch circuits alternatingly activate during the first and second bit times.

8. A method of operation in a voltage-mode DAC, the method comprising:
operating multiple bit processing circuits to generate an output voltage responsive to a binary input, the operating of each of the multiple bit processing circuits including
selectively coupling one of multiple reference voltages to a first output load in response to receiving a first input bit during a first bit time, the first output load having a value proportional to a scaling value d,
selectively coupling one of the multiple reference voltages to a second output load in response to receiving a second input bit during a second bit time, the second output load having a value corresponding to the first output load; and
wherein the first and second output loads are disposed in parallel, and serially couple to a third output load having a value proportional to a relationship (1-d).

9. The method according to claim 8, wherein the operating is carried out using a return-to-zero protocol.

10. The method according to claim 8, wherein the selectively coupling to the first and second output loads is carried out in response to alternatingly activating corresponding first and second switch circuits.

11. A voltage-mode driver, comprising:
a first voltage-mode sub-driver to selectively couple one of multiple reference voltages to a first output load in response to receiving a first input bit during a first bit time, the first output load having a value proportional to a scaling value d,
a second voltage-mode sub-driver to selectively couple one of the multiple reference voltages to a second output load in response to receiving a second input bit during a second bit time, the second output load having a value corresponding to the first output load, and
wherein the first and second output loads are disposed in parallel, and serially couple to a third output load having a value proportional to a relationship (1-d).

12. The voltage-mode driver according to claim 11, wherein the first and second voltage-mode sub-drivers each comprise push-pull voltage-mode sub-drivers.

13. The voltage-mode DAC according to claim 11, wherein the scaling value d comprises a selectable value between 0 and 1 such that the first and second output loads cooperate to exhibit hybrid direct driver and split driver characteristics.

14. The voltage-mode DAC according to claim 11, wherein the first and second switching circuits are sequenced during the first and second bit times in accordance with a return-to-zero protocol.

15. The voltage-mode DAC according to claim 11, further comprising:
a current-steering output stage coupled to the third output load.

16. The voltage-mode DAC according to claim 15, wherein the current-steering output stage includes tunable current source/sink circuitry to compensate for common-mode data signals.

17. The voltage-mode DAC according to claim 11, wherein the first and second switch circuits alternatingly activate during the first and second bit times.

\* \* \* \* \*